United States Patent
Roohparvar

(10) Patent No.: US 7,093,173 B2
(45) Date of Patent: *Aug. 15, 2006

(54) SYNCHRONOUS FLASH MEMORY WITH TEST CODE INPUT

(75) Inventor: Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/006,328

(22) Filed: Dec. 6, 2004

(65) Prior Publication Data

US 2005/0097412 A1     May 5, 2005

Related U.S. Application Data

(63) Continuation of application No. 09/829,136, filed on Apr. 9, 2001, now Pat. No. 6,865,702.

(51) Int. Cl.
*G11C 29/00*     (2006.01)

(52) U.S. Cl. ..................................................... 714/718

(58) Field of Classification Search ......... 714/718–723
See application file for complete search history.

(56) References Cited

U.S. PATENT DOCUMENTS

| | | | |
|---|---|---|---|
| 5,057,715 A | 10/1991 | Larsen et al. | |
| 5,177,745 A * | 1/1993 | Rozman | ....................... 714/718 |
| 5,526,364 A | 6/1996 | Roohparvar | |
| 5,696,917 A | 12/1997 | Mills et al. | |
| 5,745,499 A * | 4/1998 | Ong | ........................... 714/721 |
| 5,802,071 A | 9/1998 | Fang et al. | |
| 5,893,927 A * | 4/1999 | Hovis | ......................... 711/171 |
| 6,005,814 A * | 12/1999 | Mulholland et al. | ........ 365/201 |
| 6,026,465 A | 2/2000 | Mills et al. | |
| 6,104,667 A | 8/2000 | Akaogi | |
| 6,104,668 A | 8/2000 | Lee et al. | |
| 6,118,711 A * | 9/2000 | Merritt | ....................... 365/200 |
| 6,154,851 A | 11/2000 | Sher et al. | |
| 6,208,564 B1 | 3/2001 | Yamada et al. | |
| 6,246,609 B1 | 6/2001 | Akaogi | |
| 6,246,626 B1 | 6/2001 | Roohparvar | |
| 6,266,282 B1 | 7/2001 | Hwang et al. | |
| 6,275,446 B1 | 8/2001 | Abedifard | |
| 6,278,654 B1 | 8/2001 | Roohparvar | |
| 6,304,488 B1 | 10/2001 | Abedifard et al. | |
| 6,304,497 B1 | 10/2001 | Roohparvar | |
| 6,304,510 B1 | 10/2001 | Nobunaga et al. | |
| 6,307,779 B1 | 10/2001 | Roohparvar | |
| 6,307,790 B1 | 10/2001 | Roohparvar et al. | |
| 6,314,049 B1 | 11/2001 | Roohparvar | |
| 6,550,028 B1 | 4/2003 | Akaogi et al. | |

\* cited by examiner

*Primary Examiner*—Guy Lamarre
*Assistant Examiner*—Cynthia Britt
(74) *Attorney, Agent, or Firm*—Leffert Jay & Polglaze, P.A.

(57) ABSTRACT

A synchronous non-volatile memory device has address input connections and data input/output connections. A test operation can be initiated that use signals provided on the address input connections and not the data input/output connections. The test mode can be entered using either commands or a combination of commands and an electronic key.

28 Claims, 3 Drawing Sheets

| Vcc | 1* | 54 | Vss |
| DQ0 | 2 | 53 | DQ15 |
| VccQ | 3 | 52 | VssQ |
| DQ1 | 4 | 51 | DQ14 |
| DQ2 | 5 | 50 | DQ13 |
| VssQ | 6 | 49 | VccQ |
| DQ3 | 7 | 48 | DQ12 |
| DQ4 | 8 | 47 | DQ11 |
| VccQ | 9 | 46 | VssQ |
| DQ5 | 10 | 45 | DQ10 |
| DQ6 | 11 | 44 | DQ9 |
| VssQ | 12 | 43 | VccQ |
| DQ7 | 13 | 42 | DQ8 |
| Vcc | 14 | 41 | Vss |
| DQML | 15 | 40 | RP# — 152 |
| WE# | 16 | 39 | DQMH |
| CAS# | 17 | 38 | CLK |
| RAS# | 18 | 37 | CKE |
| CS# | 19 | 36 | VccP — 154 |
| BA0 | 20 | 35 | A11 |
| BA1 | 21 | 34 | A9 |
| A10 | 22 | 33 | A8 |
| A0 | 23 | 32 | A7 |
| A1 | 24 | 31 | A6 |
| A2 | 25 | 30 | A5 |
| A3 | 26 | 29 | A4 |
| Vcc | 27 | 28 | Vss |

SYNCHRONOUS FLASH MEMORY WITH TEST CODE INPUT

RELATED APPLICATION

This is a continuation application of U.S. patent application Ser. No. 09/829,136, filed Apr. 9, 2001, now U.S. Pat. No. 6,865,702 titled "SYNCHRONOUS FLASH MEMORY WITH TEST CODE INPUT" (allowed), which is commonly assigned, the entire contents of which are incorporated herein by reference.

TECHNICAL FIELD OF THE INVENTION

The present invention relates generally to non-volatile memory devices and in particular the present invention relates to testing non-volatile memory.

BACKGROUND OF THE INVENTION

Memory devices are typically provided as internal storage areas in the computer. The term memory identifies data storage that comes in the form of integrated circuit chips. There are several different types of memory. One type is RAM (random-access memory). This is typically used as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modern PCS have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAM's can be accessed quickly, but are volatile. Many computer systems are designed to operate using SDRAM, but would benefit from non-volatile memory.

Further, as the geometries and cost of integrated circuit memories continues to be reduced, the costs associated with testing the memories is becoming a more significant component of the total manufacturing cost. Specifically, before delivery to end users, each memory chip must be tested to ensure that it is functioning properly. Typically, the entire memory array must be tested.

For example, a common testing procedure for a memory connected to a memory tester is to first have the tester send a command to the memory to erase all of its bits to "1". The tester then reads the memory cells to verify that they are all "1". Next, zeros are written to all of the bits of the memory and the cells are read in order to verify that they are all "0". Then, all of the bits of the memory are erased, a checkerboard pattern is written to the memory and the cells are read in order to verify that the checkerboard pattern is present. Finally, all of the bits of the memory are erased, an inverted checkerboard pattern is written to the memory, and the cells are read in order to verify that the inverted checkerboard pattern is present. This testing procedure is a good way to find out if any of the bits of the memory are shorted to an adjacent bit, to a high level, or to a low state, or if there are any other problems.

Because the cost of testing has becoming a significant component of the total manufacturing cost of memory chips, testing using compressed data lines can be implemented. See U.S. Pat. No. 5,787,097 entitled "Output Data Compression Scheme for Use in Testing IC Memories," issued Jul. 28, 1998. This patent describes a system for compressing data during a test operation so that multiple memory devices can be simultaneously tested using a common tester. That is, each memory device uses a subset of its data output connections.

To conduct test operations on a memory device, the memory device is placed in a test mode. Because the test mode should not be entered accidentally, an electronic key is often used to restrict access to test modes. For example, a high voltage may be required on a specific input connection to enter a test mode. Further, a test mode code can be provided on data input connections to instruct the memory device which test is to be selected. If the memory is operated in a compressed mode, complicated circuitry is needed to detect the test mode codes on the data connections.

For the reasons stated above, and for other reasons stated below which will become apparent to those skilled in the art upon reading and understanding the present specification, there is a need in the art for a non-volatile memory device that can operate in a compressed data mode and easily select between different test modes.

SUMMARY OF THE INVENTION

The above-mentioned problems with memory devices and other problems are addressed by the present invention and will be understood by reading and studying the following specification.

In one embodiment, a non-volatile memory device comprises address input connections to receive externally provided signals, and control circuitry coupled to the address input connections to place the non-volatile memory device in a test mode selected by the externally provided signals.

In another embodiment, a flash memory device comprises an array of non-volatile memory cells, control input connections to receive control signals, data connections for bi-directional data communication, address input connections to receive externally provided address and test mode code signals, and control circuitry coupled to the address input connections to place the non-volatile memory device in a test mode selected by the test mode code signals.

A memory system is provided that comprises an external memory controller, and a flash memory device coupled to the external memory controller. The flash memory device comprises an array of non-volatile memory cells, control input connections to receive control signals from the external memory controller, data connections for bi-directional data communication with the external memory controller, address input connections to receive externally provided address and test mode code signals from the external memory controller, and control circuitry coupled to the address input connections to place the non-volatile memory device in a test mode selected by the test mode code signals.

A method of testing a non-volatile memory device comprises initiating a test operation of the non-volatile memory device, and selecting a test mode in response to a test code provided on address inputs.

In another embodiment, a method of testing a non-volatile memory device comprises checking a state of a test latch circuit, receiving test mode commands on address inputs, placing the non-volatile memory device in a test mode if the test latch circuit is in a first state, and prohibiting the test mode if the test latch circuit is in a second state. A test mode is selected in response to a test code provided on the address inputs.

In yet another embodiment, a method of operating a non-volatile memory device comprises performing a first Load Command Register operation. Wherein the first Load Command Register operation comprises receiving a test mode command on address input connections when a chip select input is active, a row access strobe input is active, a column access strobe input is active and a write enable input is inactive. The test mode command initiates a test mode. The method further comprises performing a second Load Command Register operation. Wherein the second Load Command Register operation comprises receiving a test code command on address input connections when a chip select input is active, a row access strobe input is active, a column access strobe input is active and a write enable input is inactive. The test code command instructs the memory device to perform a selected test operation.

A method of testing a memory device having X selectable tests is provided. The method comprises initiating a test mode, and selecting one of the X selectable tests using a test code provided on address input connections.

BRIEF DESCRIPTION OF THE DRAWINGS

FIG. 2 illustrates an interconnect pin assignment of one embodiment of the present invention.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
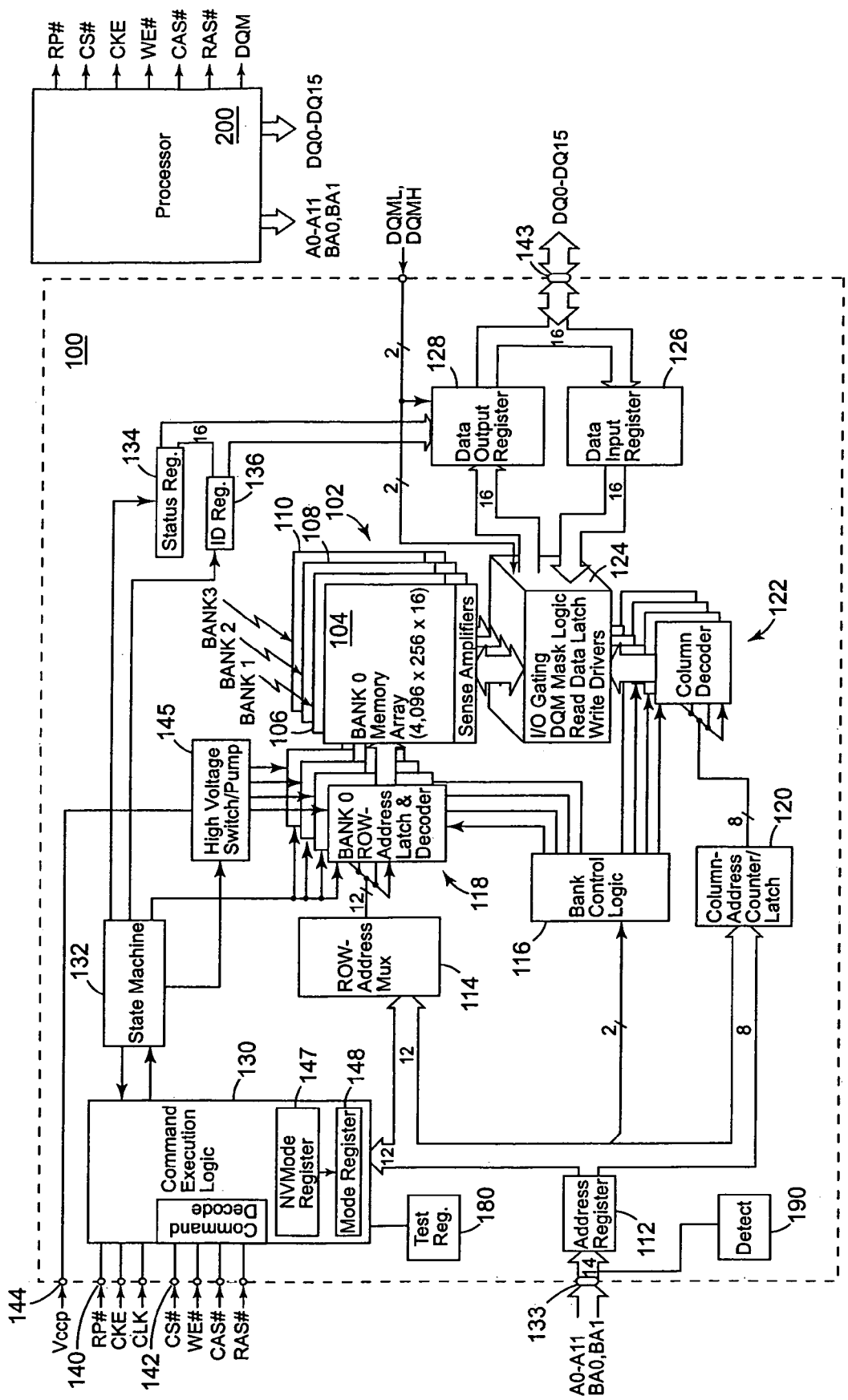
FIG. 1 is a block diagram of a synchronous flash memory of the present invention.

Referring to FIG. 1, a block diagram of one embodiment of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 via address signal connections. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128 via data connections. Command execution logic 130 is provided to control the basic operations of the memory device. A state machine 132 is also provided to control specific operations performed on the memory array and cells. A status register 134 and an identification register 136 can also be provided to output data. The command circuit 130 and/or state machine 132 can be generally referred to as control circuitry to control read, write, erase and other memory operations. The data connections are typically used for bi-directional data communication. The memory can be coupled to an external processor 200 for operation or testing.

FIG. 2 illustrates an interconnect pin assignment of one embodiment of the present invention. The memory package 150 has 54 interconnect pins. The pin configuration is substantially similar to available SDRAM packages. Two interconnects specific to the present invention are RP# 152 and Vccp 154. Although the present invention may share interconnect labels that are appear the same as SDRAM's, the function of the signals provided on the interconnects are described herein and should not be equated to SDRAM's unless set forth herein.

Prior to describing the operational features of the memory device, a more detailed description of the interconnect pins and their respective signals is provided. The input clock connection is used to provide a clock signal (CLK). A system clock can drive the clock signal, and all synchronous flash memory input signals are sampled on the positive edge of CLK. CLK also increments an internal burst counter and controls the output registers.

The input clock enable (CKE) connection is used to activate (HIGH state) and deactivates (LOW state) the CLK signal input. Deactivating the clock input provides POWER-DOWN and STANDBY operation (where all memory banks are idle), ACTIVE POWER-DOWN (a memory row is ACTIVE in either bank) or CLOCK SUSPEND operation (burst/access in progress). CKE is synchronous except after the device enters power-down modes, where CKE becomes asynchronous until after exiting the same mode. The input buffers, including CLK, are disabled during power-down modes to provide low standby power. CKE may be tied HIGH in systems where power-down modes (other than RP# deep power-down) are not required.

The chip select (CS#) input connection provides a signal to enable (registered LOW) and disable (registered HIGH) a command decoder provided in the command execution logic. All commands are masked when CS# is registered HIGH. Further, CS# provides for external bank selection on systems with multiple banks, and CS# can be considered part of the command code; but may not be necessary.

The input command input connections for RAS#, CAS#, and WE# (along with CAS#, CS#) define a command that is to be executed by the memory. The input/output mask (DQM) connections are used to provide input mask signals for write accesses and an output enable signal for read accesses. Input data is masked when DQM is sampled HIGH during a WRITE cycle. The output buffers are placed in a high impedance (High-Z) state (after a two-clock latency) when DQM is sampled HIGH during a READ cycle. DQML corresponds to data connections DQ0–DQ7 and DQMH corresponds to data connections DQ8–DQ15. DQML and DQMH are considered to be the same state when referenced as DQM.

Address inputs 133 are primarily used to provide address signals. In the illustrated embodiment the memory has 12 lines (A0–A11). Other signals can be provided on the address connections, as described below. In one embodiment of the present invention, test mode codes are received by the memory via the address inputs. The address inputs are sampled during an ACTIVE command (row-address A0–A11) and a READ/WRITE command (column-address A0–A7) to select one location in a respective memory bank. The address inputs are also used to provide an operating code (OpCode) during a LOAD COMMAND REGISTER operation, explained below. Address lines A0–A11 are also used to input mode settings during a LOAD MODE REGISTER operation.

An input reset/power-down (RP#) connection 140 is used for reset and power-down operations. Upon initial device power-up, a 100 µs delay after RP# has transitioned from LOW to HIGH is required in one embodiment for internal device initialization, prior to issuing an executable command. The RP# signal clears the status register, sets the internal state machine (ISM) 132 to an array read mode, and places the device in a deep power-down mode when LOW. During power down, all input connections, including CS# 142, are "Don't Care" and all outputs are placed in a High-Z state. When the RP# signal is equal to a VHH voltage (5V), all protection modes are ignored during WRITE and ERASE. The RP# signal also allows a device protect bit to be set to 1 (protected) and allows block protect bits of a 16 bit register, at locations 0 and 15 to be set to 0 (unprotected) when brought to VHH. The protect bits are described in more detail below. RP# is held HIGH during all other modes of operation.

Bank address input connections, BA0 and BA1 define which bank an ACTIVE, READ, WRITE, or BLOCK PROTECT command is being applied. The DQ0–DQ15 connections 143 are data bus connections used for bi-directional data communication. A VCCQ connection is used to provide isolated power to the DQ connections to improved noise immunity. In one embodiment, VCCQ=Vcc or 1.8V±0.15V. The VSSQ connection is used to isolated ground to DQs for improved noise immunity. The VCC connection provides a power supply, such as 3V. A ground connection is provided through the Vss connection. Another optional voltage is provided on the VCCP connection 144. The VCCP connection can be tied externally to VCC, and sources current during device initialization, WRITE and ERASE operations. That is, writing or erasing to the memory device can be performed using a VCCP voltage, while all other operations can be performed with a VCC voltage. The Vccp connection is coupled to a high voltage switch/pump circuit 145.

The following sections provide a more detailed description of the operation of the synchronous flash memory. One embodiment of the present invention is a nonvolatile, electrically sector-erasable (Flash), programmable read-only memory containing 67,108,864 bits organized as 4,194,304 words by 16 bits. Other population densities are contemplated, and the present invention is not limited to the example density. Each memory bank is organized into four independently erasable blocks (16 total). To ensure that critical firmware is protected from accidental erasure or overwrite, the memory can include sixteen 256K-word hardware and software lockable blocks. The memory's four-bank architecture supports true concurrent operations.

A read access to any bank can occur simultaneously with a background WRITE or ERASE operation to any other bank. The synchronous flash memory has a synchronous interface (all signals are registered on the positive edge of the clock signal, CLK). Read accesses to the memory can be burst oriented. That is, memory accesses start at a selected location and continue for a programmed number of locations in a programmed sequence. Read accesses begin with the registration of an ACTIVE command, followed by a READ command. The address bits registered coincident with the ACTIVE command are used to select the bank and row to be accessed. The address bits registered coincident with the READ command are used to select the starting column location and bank for the burst access.

The synchronous flash memory provides for programmable read burst lengths of 1, 2, 4 or 8 locations, or the full page, with a burst terminate option. Further, the synchronous flash memory uses an internal pipelined architecture to achieve high-speed operation. In general, the synchronous flash memory is configured similar to a multi-bank DRAM that operates at low voltage and includes a synchronous interface. Each of the banks is organized into rows and columns.

The synchronous flash is powered up and initialized in a predefined manner. After power is applied to VCC, VCCQ and VCCP (simultaneously), and the clock signal is stable, RP# 140 is brought from a LOW state to a HIGH state. A delay, such as a 100 µs delay, is needed after RP# transitions HIGH in order to complete internal device initialization. After the delay time has passed, the memory is placed in an array read mode and is ready for Mode Register programming or an executable command. After initial programming of a non-volatile mode register 147 (NVMode Register), the contents are automatically loaded into a volatile Mode Register 148 during the initialization. The device will power up in a programmed state and will not require reloading of the non-volatile mode register 147 prior to issuing operational commands.

The Mode Register 148 is used to define the specific mode of operation of the synchronous flash memory. This definition includes the selection of a burst length, a burst type, a CAS latency, and an operating mode. The Mode Register is programmed via a LOAD MODE REGISTER command and retains stored information until it is reprogrammed. The following table defines the Load Mode Register command.

| NAME (FUNCTION) | CS # | RAS # | CAS # | WE # | ADDR | DQs |
|---|---|---|---|---|---|---|
| LOAD COMMAND REGISTER | L | L | L | H | Command Code | X |

The contents of the Mode Register may be copied into the NVMode Register 147. The NVMode Register settings automatically load the Mode Register 148 during initialization. Those skilled in the art will recognize that an SDRAM requires that a mode register must be externally loaded during each initialization operation. The present memory allows a default mode to be stored in the NV mode register 147. The contents of the NV mode register are then copied into a volatile mode register 148 for access during memory operations.

Mode Register bits M0–M2 specify a burst length, M3 specifies a burst type (sequential or interleaved), M4–M6 specify a CAS latency, M7 and M8 specify a operating mode.

Read accesses to the synchronous flash memory can be burst oriented, with the burst length being programmable. The burst length determines the maximum number of column locations that can be automatically accessed for a given READ command. When a READ command is issued, a block of columns equal to the burst length is effectively selected. The block is uniquely selected by address lines A1–A7 when the burst length is set to two, by A2–A7 when the burst length is set to four, and by A3–A7 when the burst length is set to eight. The remaining (least significant) address bit(s) are used to select the starting location within the block. Accesses within a given burst may be programmed to be either sequential or interleaved. This is referred to as the burst type and is selected via bit M3. The ordering of accesses within a burst is determined by the burst length, the burst type and the starting column address.

A test mode must be entered to initiate a test operation on the memory device. During production testing, a software command can be used to enter the test mode. That is, providing a specific command sequence to the memory can enter the test mode. To prevent a user from accidentally initiating a test mode operation, a non-volatile data register 180 is provided. If the data register is not programmed, a test mode can be entered using commands only. Once the data register is programmed, often following production testing, an electronic key is required to initiate a test mode. For example, an elevated voltage must be provided on a preselected address input connection to initiate a test mode. Thus, a voltage detection circuit 190 monitors the address input. Once an elevated voltage is detected, the test mode is entered and a selected test can be specified.

As explained above, the memory can be operated in a compressed mode such that only a portion of its data (DQ) connections are used. For example, in one embodiment a four-to-one compression scheme uses four of sixteen data connections. Four memory devices can be tested using one sixteen-wide data bus. If the data lines are used to communicate test codes, congestion can be experienced which results in bus wait time. To over come this problem, the present invention uses some of the address lines to provide the test mode codes.

In one embodiment, providing a command sequence that includes three sequential Load Command Register operations enters a test command mode. A Load Command Register operation is described in the following table.

| NAME (FUNCTION) | CS # | RAS # | CAS # | WE # | ADDR | DQs |
|---|---|---|---|---|---|---|
| LOAD COMMAND REGISTER | L | L | L | H | Command/ Code | X |

Figure 3:
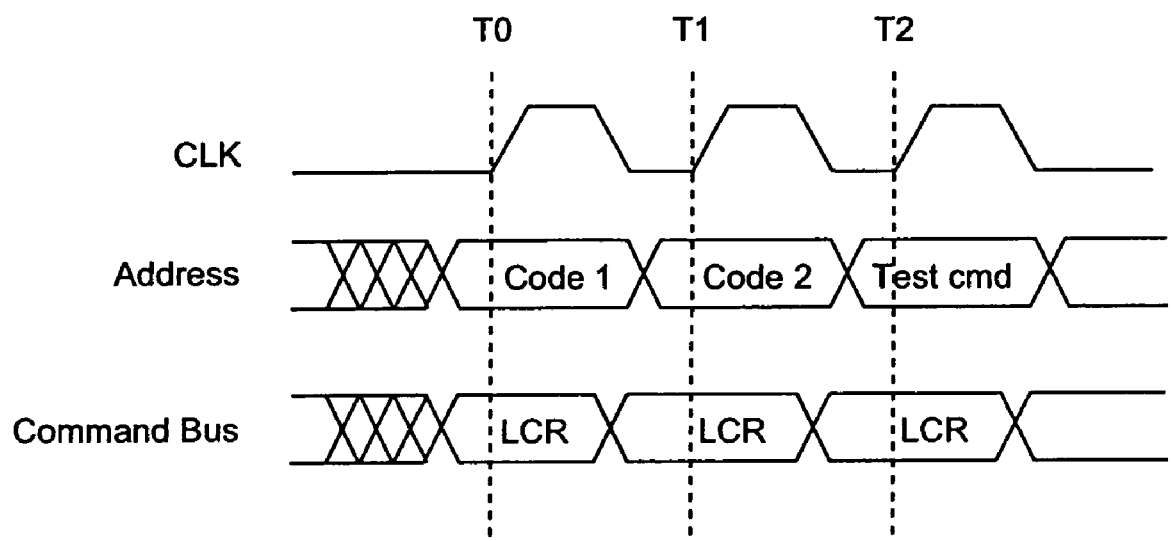
FIG. 3 is a timing diagram of an example operation of the present invention.

Referring to FIG. 3, a simplified timing diagram is provided of a sample test operation. At times T0 and T1, first and second Load Command Register operations are accompanied by address signals, code 1 and code 2, which instruct the memory to enter a test mode. The third Load Command Register operation, at time T2, is accompanied by a test command code provided on the address inputs that instruct the memory which test mode operation is to be performed.

CONCLUSION

A synchronous non-volatile memory device has been described that has address input connections and data input/output connections. A test operation can be initiated that use signals provided on the address input connections and not the data input/output connections. The test mode can be entered using either commands or a combination of commands and an electronic key.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device, comprising:
   address input connections to receive externally provided signals; and
   control circuitry coupled to the address input connections, wherein the control circuitry is adapted to place the non-volatile memory device in a test mode in response to the externally provided signals.

2. The memory device of claim 1, further comprising a test mode latch circuit.

3. The memory device of claim 2, wherein the control circuitry is adapted to initiate a test operation in response to externally provided commands when the test mode latch is in a first state.

4. The memory device of claim 2, wherein the control circuitry is adapted to initiate a test operation in response to externally provided commands and an electronic key when the test mode latch is in a second state.

5. The memory device of claim 4, wherein the electronic key comprises a voltage detection circuit coupled to an external input connection to detect an selected voltage level applied to the external input connection.

6. The memory device of claim 5, wherein the external input connection is one of the address input connections.

7. The memory device of claim 1, wherein the control circuit is adapted to place the memory device into a compressed data mode in response to externally provided commands.

8. The memory device of claim 1, wherein the memory device is a non-volatile memory device.

9. A non-volatile memory device, comprising:
  address input connections to receive externally provided signals; and
  a means for placing the non-volatile memory device in a test mode selected by the externally provided signals on the address input connections.

10. The non-volatile memory device of claim 9, further comprising a test mode latch circuit.

11. The non-volatile memory device of claim 10, further comprising a means for initiating a test operation in response to externally provided commands when the test mode latch is in a first state.

12. The non-volatile memory device of claim 10, further comprising a means for initiating a test operation in response to externally provided commands and an electronic key when the test mode latch is in a second state.

13. The non-volatile memory device of claim 12, wherein the electronic key comprises a means for detecting an elevated voltage applied to an external input connection.

14. The non-volatile memory device of claim 13, wherein the external input connection is one of the address input connections.

15. The non-volatile memory device of claim 9, further comprising a means for placing the non-volatile memory device into a compressed data mode in response to externally provided commands.

16. A non-volatile memory device, comprising:
  address input connections and control input connections to receive externally provided signals; and
  control circuitry coupled to the address input connections and control input connections, wherein the control circuit is adapted to initiate a test mode in response to a first Load Command Register operation and to place the non-volatile memory device in a test mode selected by the externally provided signals on the address input connections in response to a second Load Command Register operation.

17. The non-volatile memory device of claim 16, wherein the first Load Command Register operation comprises receiving a test mode command on address input connections when a chip select input is active, a row access strobe input is active, a column access strobe input is active and a write enable input is inactive, where the test mode command initiates a test mode, and wherein the second Load Command Register operation comprises receiving a test code command on address input connections when a chip select input is active, a row access strobe input is active, a column access strobe input is active and a write enable input is inactive, where the test code command instructs the memory device to perform a selected test operation.

18. The non-volatile memory device of claim 16, further comprising a test mode latch circuit.

19. The non-volatile memory device of claim 18, wherein the control circuitry is adapted to initiate a test operation in response to the first Load Command Register operation when the test mode latch is in a first state.

20. The non-volatile memory device of claim 18, wherein the control circuitry is adapted to initiate a test operation in response to the first Load Command Register operation and an electronic key when the test mode latch is in a second state.

21. The non-volatile memory device of claim 20, wherein the electronic key comprises a voltage detection circuit coupled to an external input connection to detect an elevated voltage applied to the external input connection.

22. The non-volatile memory device of claim 21, wherein the external input connection is one of the address input connections.

23. A method of entering a test mode of operation in a memory device, comprising:
  receiving a test mode command on address inputs;
  checking a state of a test latch circuit;
  placing the memory device in a test mode of operation if the test latch circuit is in a first state, and prohibiting the memory device from entering the test mode of operation if the test latch circuit is in a second state; and
  if the memory is placed in a test mode of operation, selecting a test mode in response to a test code provided on the address inputs.

24. The method of claim 23, wherein receiving the test mode command on address inputs further comprise:
  performing a first Load Command Register operation, wherein the first Load Command Register operation comprises receiving a test mode command on the address inputs when a chip select input is active, a row access strobe input is active, a column access strobe input is active and a write enable input is inactive, wherein the test mode command enters the test mode; and
  performing a second Load Command Register operation, wherein the second Load Command Register operation comprises receiving a test code command on address inputs when a chip select input is active, a row access strobe input is active, a column access strobe input is active and a write enable input is inactive, wherein the test code command instructs the memory device to perform a selected test operation.

25. The method of claim 23, further comprising placing the memory device in the test mode of operation if the test latch circuit is in the second state, and a selected voltage signal is detected on a pre-determined address input.

26. The method of claim 23, further comprising placing the memory device in a compressed data mode.

27. A method of receiving a test code in a memory device while in a test mode of operation, comprising:
  receiving a test code command containing a test code on address inputs; and
  selecting a test mode in response to the test code provided on the address inputs.

28. The method of claim 27, wherein receiving the test code command on address inputs further comprise:
  performing a Load Command Register operation, wherein the Load Command Register operation comprises receiving a test code command on address inputs when a chip select input is active, a row access strobe input is active, a column access strobe input is active and a write enable input is inactive, wherein the test code command instructs the memory device to perform a selected test operation.

* * * * *